United States Patent [19]
Dunn

[11] Patent Number: 5,884,315
[45] Date of Patent: Mar. 16, 1999

[54] SYSTEM AND METHOD FOR HANDLING TECHNICAL HARDWARE RELATED INFORMATION

[75] Inventor: Chester F. Dunn, Morristown, Tenn.

[73] Assignee: Philips Electronics North America Corporation, NY, N.Y.

[21] Appl. No.: 773,119

[22] Filed: Dec. 26, 1996

Related U.S. Application Data

[60] Provisional application No. 60/017,217, May, 9, 1996.

[51] Int. Cl.$^6$ .................................................. G06F 17/00
[52] U.S. Cl. .......................................... 707/102; 707/104
[58] Field of Search .................................. 345/419, 333; 395/704, 182.13; 707/1, 3, 102, 103, 100, 104; 704/9; 365/200

[56] References Cited

U.S. PATENT DOCUMENTS

| | | | |
|---|---|---|---|
| 5,119,483 | 6/1992 | Madden et al. | 395/182.13 |
| 5,303,367 | 4/1994 | Leenstra, Sr. et al. | 707/102 |
| 5,367,671 | 11/1994 | Feigenbaum et al. | 707/1 |
| 5,454,101 | 9/1995 | Mackay et al. | 707/3 |
| 5,566,333 | 10/1996 | Olson et al. | 707/102 |
| 5,649,192 | 7/1997 | Stucky | 707/103 |
| 5,655,121 | 8/1997 | Delagi et al. | 395/704 |
| 5,682,468 | 10/1997 | Fortenbery et al. | 345/419 |

FOREIGN PATENT DOCUMENTS 9526532  10/1995  WIPO .

*Primary Examiner*—Wayne Amsbury
*Assistant Examiner*—Thuy Pardo
*Attorney, Agent, or Firm*—Steven R. Biren

[57] ABSTRACT

A system and method for handling technical data organizes and links information in a computer format that is readily accessible and easily useable. The system includes and provides a mechanism to arrange and store technical information from many different sources, regarding many different subjects, in one data set. The data set preferably includes a plurality of diagrams that each contain a plurality of components, identifying information that identifies each component and descriptive information that describes the components. The information is linked together so that the various distinct aspects thereof are readily accessed, as selected, by a user.

14 Claims, 5 Drawing Sheets

SYSTEM AND METHOD FOR HANDLING TECHNICAL HARDWARE RELATED INFORMATION

CROSS-REFERENCE TO RELATED APPLICATION

This application is related to and claims the benefit of the provisional application filed May 9, 1996, having Ser. No. 60/017,217.

BACKGROUND OF THE INVENTION

This invention generally relates to information retrieval systems. More specifically, this invention relates to a system and method for storing large volumes of technical information in a manner that provides the ability to easily access and flexibly use the information.

Some occupations require the use of large amounts of technical information. The service industry of consumer electronics is one example. In that case, the traditional manner of providing technical information to a service technician is through a printed service manual. Providing such information through printed service manuals, however, has many drawbacks, including that manuals are expensive to print, mail, store and update. Moreover, as technology advances and consumer electronics products become more complex, it becomes increasingly difficult to provide printed manuals that are accurate, adequately informative and useful to a technician. In particular, it becomes increasingly difficult to provide printed manuals that are not significantly encumbered by the complexity and volume of information provided. Indeed, these drawbacks tend to become more problematic as the number of products, and therefore manuals, increases.

With advances in electronics technology, the service industry faces another difficulty: the increasing complexity of consumer electronics products makes repairs more difficult and often more expensive, such that product replacement can be more economic than repair. Accordingly, service technicians generally are compelled to work more efficiently and at lower rates. However, that effort can be impeded by the complexity and size of printed service manuals. Accordingly, there is a need in the service industry for provision of technical information in such a manner that will speed up and facilitate the repair process.

SUMMARY OF THE INVENTION

An object of this invention is to provide for easy access to and flexible use of technical information, such as that contained in service manuals. Another object of this invention is to place such technical information in computer format that is easily accessible. Yet another object of this invention is to provide for storing, on one computer, technical information from a plurality of manufacturers respecting various types of product. Still another object of this invention is to provide for linking together various distinct aspects of technical information. A further object of this invention is to enhance a technician's productivity and troubleshooting capabilities while also reducing the need for printing, mailing, storing, and updating printed manuals.

The invention achieves these objects by providing a system for accessing and using technical data, including a data set containing the technical data. The data set includes at least two types of written information, such as, for example, identifying information for identifying each of a number of items or components and descriptive information for describing each of the items or components. The data set also includes a number of technical diagrams illustrating selected ones of the items or components, each item on each diagram generally having a specified diagram location. The data set further includes lining information for linking the identifying information, the descriptive information and the diagram location for each item or component.

The system also comprises a control module for controlling access to the data set. The control module has an associated interface device by which a user interfaces with the control module to locate a selected item in the data set, e.g., by reviewing the diagrams or choosing access through the identifying information or the descriptive information. The control module provides for automatic access to all information, including diagrams, in response to commands generated by a user. The linking information enables the control module to move between and among the various aspects of the technical data for each component.

A significant advantage provided by this invention is that manuals of various manufacturers and product types (TVS, VCRs, etc.) is stored in and accessed from a single computer and all technical information from these manuals is stored in a substantially similar data structure regardless of the original printed format. Accordingly, the service technician can readily locate and use the needed manual and can do so largely without substantial effort to shift mindset or to understand the completely different styles common today among the various manufacturers' printed service manuals. This provides a significant improvement in the usability of technical service information from what is conventional today.

Another advantage provided by this invention is the capability to readily associate related technical information. Conventionally, separate documents have been used to provide related technical information that may apply to one or more different products, which information typically spans years of time. Accordingly, the burden has fallen on the technician to associate such documents, generally by physically consolidating the documents. This invention, however, enables the service manual developer (and technician) to associate related technical information, such as known fault, training and troubleshooting information, to the implicated service manual for each specific product, and part thereof, as the case may be. The technician is thereby provided with a single program through which all technical information pertaining to the product is instantly accessible, regardless of product brand or type. The result is a significant time savings to the service technician by providing clear, useable access to all known data. This also results in a reduction of the number of inquiries by technicians to gain knowledge of material that was previously published but not in a format that is readily useable, which reduction in turn reduces the support costs borne by manufactures.

Another advantage of this invention is that it facilitates transmitting service information over modems in the shortest possible time. To gain this advantage the technical information is compressed. For example, graphics preferably are compressed using the TIFF Group IV standard, while text preferably is compressed using Compression Plus, which is available from MicroHelp of Marietta, Ga. As any text or graphic is displayed, that information must first be decompressed for viewing.

These and other features and advantages will become apparent to those skilled in the art through the following detailed description of the preferred embodiments.

DETAILED DESCRIPTION OF PREFERRED EMBODIMENTS

Figure 1:
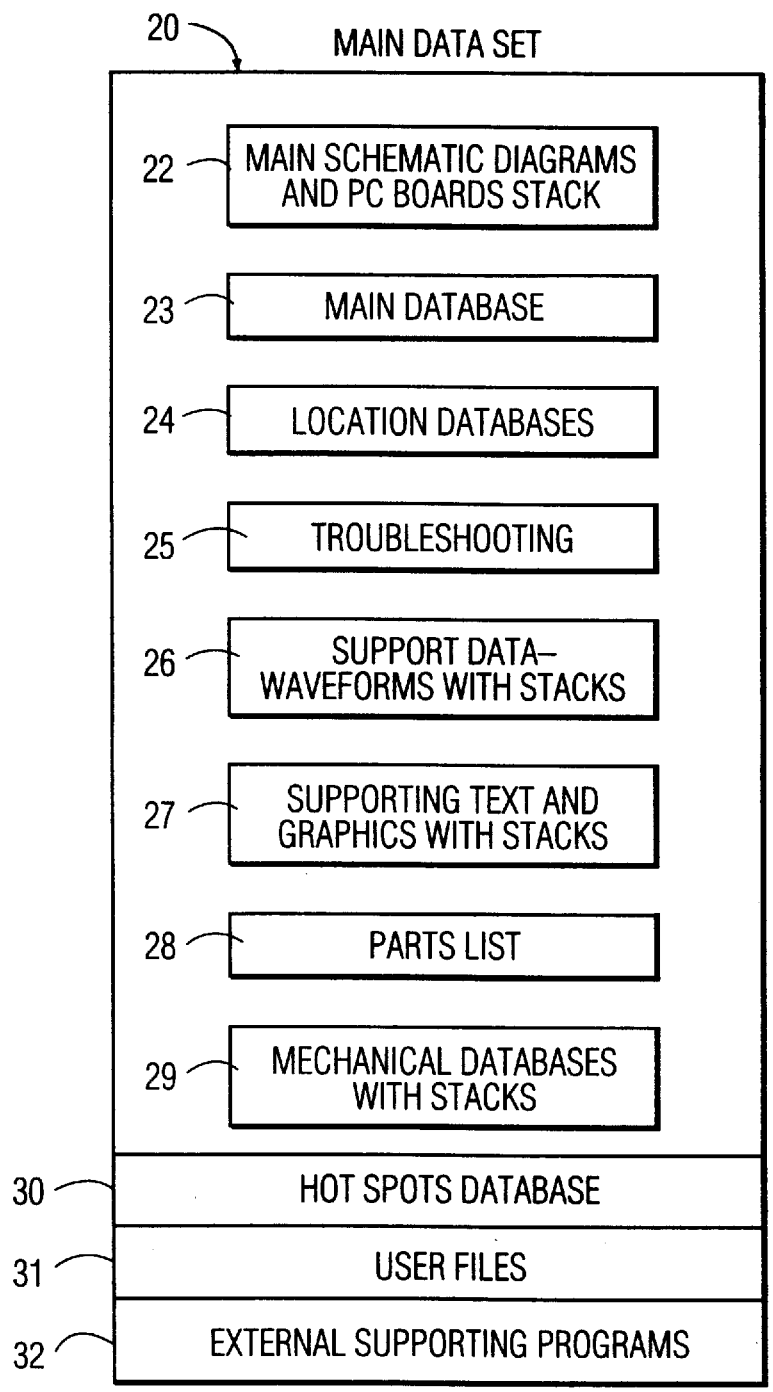
FIG. 1 is a block diagram illustrating a data set structure associated with this invention.

This invention is a system and method for storing large volumes of technical information in a format that allows a user to access and use that information from a computer. The following description relates to technical information in the form of service manuals for consumer electronics products. This invention is not limited, however, to such service manuals. Rather, this invention can be utilized for storing and utilizing technical service information for any product, in any form.

A program designed according to this invention preferably operates in a Windows™ environment. (Windows™ is a trademark of Microsoft Corporation, Redmond, Wash.) The program preferably has rich text file capabilities. In other words, the ability to display and manipulate graphics and written text are included. The presently preferred embodiment requires Windows™ 3.1 version or a more recent version and can be operated from a 386 PC with at least a 4 Mb RAM and a VGA or better display. The program preferably is operated from the hard drive on the computer. The program preferably includes hyperlinks, such as those which provide access to on-line information, including information available via the Internet.

A program designed according to this invention preferably operates from a main graphics program that serves as a control module, such program being referred to as a graphics engine. Such graphics engines are commercially available, including from AccuSoft Corporation of Massachusetts under the AccuSoft IFL (Image Format Library) brand.

The graphics engine provides the program with various features. For example, the graphics engine (i) provides for using diagrams in many different formats, (ii) provides for using highly compressed graphics files and, thereby, reducing the size of the complete manual so as to enhance both storage on available hard drive systems and practical distribution via electronic means (e.g., bulletin board systems and Internet applications), and (iii) enhances program speed so that the time required for a technician to locate and display a schematic using the computer is less than the time required to locate and open the paper-equivalent schematic. The ability of the program to make use of single bit diagrams greatly enhances all of the processes described above, e.g., speed, size and usability.

The second main component of the program is a set of database files. The database files facilitate the user's access to the contained data, define relationships between associated text and graphics files, and effectively create links to any and all selected data.

Generally, these database files contain descriptions of all of the information normally associated with a printed service manual and the pointers to related graphics files (stacks) and text files. The main database includes text descriptions of all diagrams in the main diagram stack, the diagrams' stack position, the stack position of any related diagrams (such as a schematic/printed circuit board relation), the grid size (x,y) of all diagrams in the stack and stop indicators for multi-sectioned diagrams.

FIG. 1 schematically illustrates the main data set 20 of a typical consumer electronics service manual. As mentioned, multiple service manuals preferably are stored on one computer. The directory structure of the hard driver preferably segments the data into manufacturers and manuals, respectively: each manufacturer being represented by a unique subdirectory under which resides unique subdirectories for each individual service manual, and these service manual directories preferably being organized by generic categories, e.g., audio, video, appliances and the like. The data contained in a manufacturer's subdirectory is specific to that manufacturer and preferably covers multiple manuals for that manufacturer. The data set contained in any one service manual subdirectory preferably is applicable only to the specific service manual for which the subdirectory is named.

For electronics products, schematic circuit diagrams and circuit board diagrams generally show how the various circuits interact and the layout of the physical circuit boards and components. Accordingly, the main stack 22 contains all schematics, circuit board diagrams and interconnect diagrams for servicing any specific product. The associated main database 23 contains additional information, including text descriptions of the diagrams within the main stack 22, while also providing various functions, including identifying each diagram stack position, identifying the related circuit board diagram defining the grid size (x,y) for component locations on the diagrams, and setting the stop points for multi-sectioned diagrams. The main stack 22 is used by database files in the main data set 20 to display information, including component locations described in a "component" database, circuit location described in a "circuit" database, fault location defined in a "known fault" and/or troubleshooting database 25 and waveforms as described in a waveform database 26. The circuit and component databases preferably are placed within a collection of locations databases 24.

The databases, including these described above, generally comprise a text description of a function (component, circuit etc), a stack position to indicate a specific diagram, the (x,y) position of the diagram on the screen and a zoom factor used to define the "view" the user sees. In addition, the known fault database preferably contains both a text description of a fault and direction as to its resolution.

In a preferred embodiment, this invention is used in the following manner, which can be understood by referring to FIG. 2. A product requiring service is identified by the technician as being of a particular manufacturer. The technician opens the program and selects the appropriate manufacturer from a list provided by a manufacturer database 40, e.g., a subdirectory for that manufacturer. The database 40 contains the path for that manufacturer's subdirectory and the paths to any external programs (preferably a maximum of three) and the external programs' executable file names.

The technician then further defines the product being serviced. For example, the technician can select either a generic product category, such as video, audio, appliance or the like, or a model number, or a chassis number (electrical package) if known, or both. As to the latter, this selection is made from an appropriate database, such as a model/chassis database 42, located in the applicable manufacturer's subdirectory. This database 42 preferably contains cross references between the manufacturer's model numbers, service manuals numbers, and chassis numbers. Selecting the appropriate model number, for example, provides the technician access to all data required to repair the specific product being serviced.

Having further defined the product, the technician then accesses information associated with the product by navigating through additional databases. In doing so, the technician need not be knowledge about the product. For example, the technician is enabled to identify and view any one or more of major assemblies, or subassemblies, or circuits, or components, or component physical locations, or signal flows, values and waveforms, or fault information, or adjustment procedures (electrical and mechanical), or parts information, or procedures to determine what is defective about the product, or any other information for the product, or its problems, parts or otherwise. Information preferably is fully randomly accessible via any of various mechanisms, including, for example, menus, hotkeys and a pointing device (such as a mouse). In addition, the user is enabled to access information developed, e.g., by the user, and previously recorded locally, e.g. by the user in a rich text format, a database format or otherwise.

Figure 2:
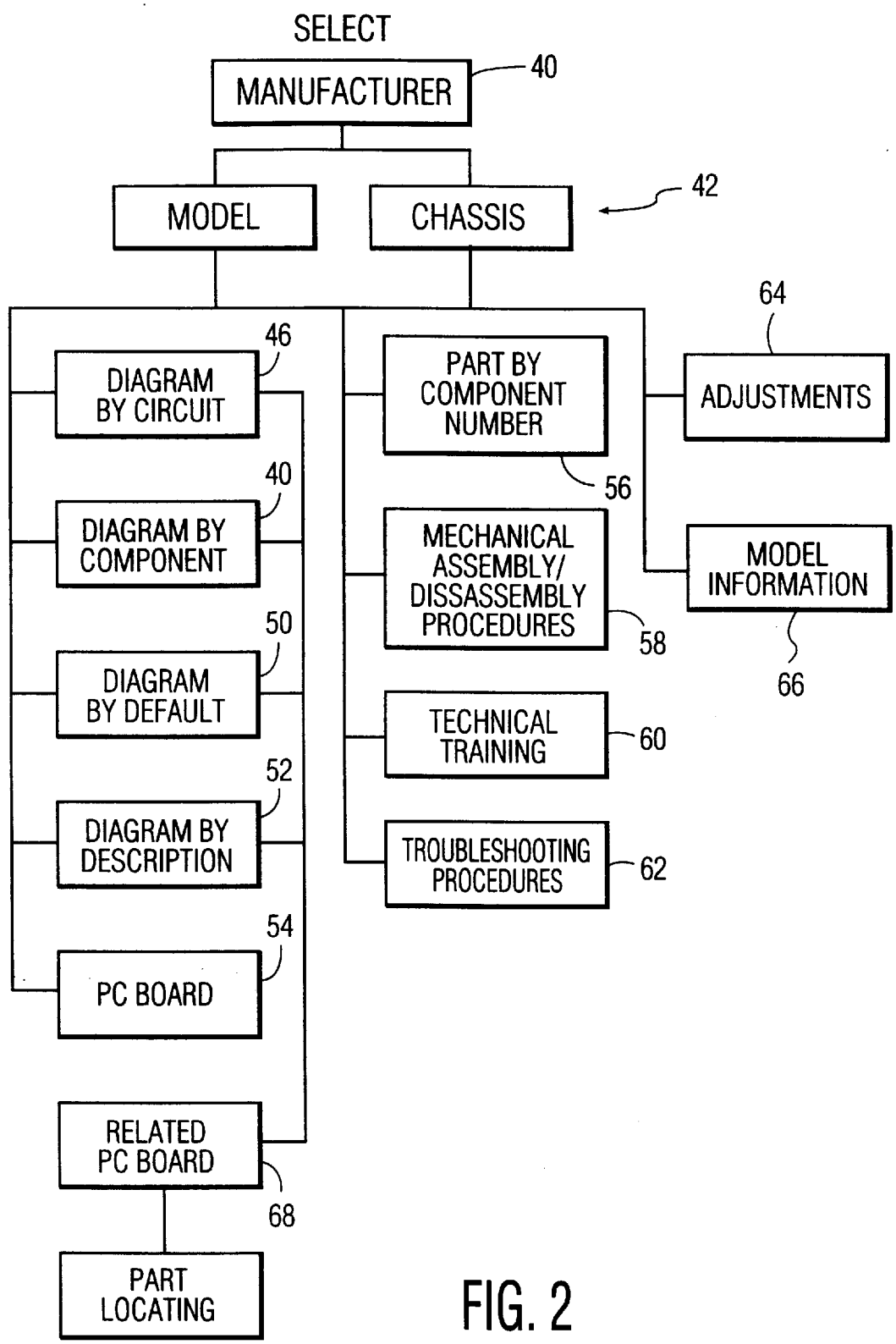
FIG. 2 is a block diagram illustrating use of this invention in a service environment.

More specifically, as illustrated in FIG. 2, once the product is further defined (e.g., its appropriate manual is located within the database 42), the technician preferably is provided a series of options from which to choose, the options typically being presented via a screen display of texts, icons, menus, or otherwise. The options enable the technician to locate a diagram by a selected circuit (via database 46), by a selected component (via database 48), by a described fault condition (via database 50), by a diagram description (via database 52), or by selected printed circuit board (via database 54), or by combinations of the above or otherwise. The technician is also enabled to gather information about a particular part by its component number (via database 56). As well, the technician preferably is enabled to gather any other information that may be relevant, such as assembly and disassembly procedures (via database 58), technical training information (via database 60), troubleshooting procedures (via database 62), adjustments (via database 64), general information (via database 66), or the like. When the technician accesses a schematic diagram via any of the databases, printed circuit boards relating to the schematic diagram preferably are linked via database 68 for automatic, interchangeable access between the schematic and the printed circuit board diagrams.

Each of the options above preferably are presented in a Windows™ menu format. The technician or user of the system, therefore, quickly and easily gains access to all of the technical information within the service manual by making simple menu choices from the screen, such as by using a conventional pointer device, e.g., a mouse.

As previously described, various databases preferably are employed. The databases are part of data set 20 and comprise stacks. The stacks include pages of graphic files. Each such page is individually accessible, such access being available to one or more of the databases of the data set 20. For example, the main database 23 contains the descriptions and pointers to all of the diagrams (pages) of the main stack 22 which stack includes, but is not limited to, schematics, circuit board layouts and interconnect diagrams for that product. Any of the pages can be displayed by selecting from a list generated by the main database 23. The location databases 24 also use the main stack 22. The descriptions in the location databases 24 are of circuits, components, and faults. The other databases provide alternate means by which graphics files can be navigated. This enables technicians with general, or even rudimentary, electronics knowledge to navigate effectively through a product service manual, even when the technician has no prior specific knowledge of that product.

Preferably a database 28 is employed that includes numbers, descriptions, identifications and other selected data relating to parts, components, assemblies, subassemblies and the like. The database 28 preferably also includes cross-references among this data. For example, the database cross-references the component with the printed circuit based with which it is associated. To achieve such cross-referencing, the database 28 preferably is organized in a plurality of databases, each linked to the other by an appropriate mechanism, e.g., a code lettering system.

The database 28 preferably supports random access. To look up a part by number while viewing a diagram, the user begins typing the number which typing causes a window automatically to open over the diagram and triggers a search for that part. Preferably, the program provides for selected or automatic interaction with an external database 32 to extract the current price, availability, substitutes, and active status for an identified part.

Another category of service information applies to products, such as a VCR, for which mechanical information is pertinent. This information is organized in database 29 and includes exploded views, adjustments, assembly-disassembly directions, and the like, in the form of text, diagrams or otherwise. Selection is made from one of the subject lists, and the diagrams and text relating to that selection are displayed, e.g. by overlapping each other.

This invention provides a method to incorporate troubleshooting information. This information preferably is in the form of an HTML file within the troubleshooting database 25. The process resembles a flow chart method so that trouble shooting is characterized by enhanced flexibility. Text, graphics, and combinations of both preferably are used in the troubleshooting database. A preferred methodology of trouble shooting is described in more detail below.

Preferably, user files 31 are also provided. One such file is an empty database structure to be used by the technician to record technical repair information to be generated locally. This file preferably is not updated by the program automatically, but instead is updated under the technician's control. A second user file is used by a built-in word processor function. This file preferably has a rich text or database format and can be used for any function selected by the technician. Other user files preferably are also supported, such files being of any appropriate format.

One or more, but preferably five (5), location databases 24 generally are supported. Each of these databases operates in a similar manner. The difference is in the content of the description field. The databases contain a text description of a circuit, component, etc. and the following ancillary information. The database uses a field to point to a page within a stack to identify a specific diagram to be displayed. Additional fields define the "view" to be established, which is the x and y coordinates for the upper left corner of the diagram to be displayed, and the value of the zoom factor to be applied to the diagram being displayed. The (x,y) grid size of a diagram is also defined. Preferably, at least one of the location databases, e.g., the component location database, exists in two distinct forms that cannot be used simultaneously in the same manual.

The supporting text and graphics database 27 preferably includes electronic adjustments, is technical training, and general information.

Electronic adjustments information includes descriptions of adjustments and additional diagrams to explain the nature of these adjustments. Technical training information preferably provides a simplified or otherwise tutorial explanation of how a circuit works so as to make it more understandable to the technician. General information includes variable data preferably in the form of text, graphics, audio, video, stills or clips, or combinations of same. For example, this general information can include model cross reference information, customer user information, safety information, individual diagram notes, or any other type of data not included in one of the other more-specialized databases.

Supporting data is provided in database 26, such data preferably including printed circuit board links for each schematic diagram, particularly for schematic diagrams that are split across more than one printed circuit board. Each diagram preferably also has troubleshooting aids in the form of known oscilloscope displays associated with specific locations. These displays link to diagrams and/or numbers prominent on the diagrams.

In an exemplary operation, the user typically identifies a selected manual by the name of the product's manufacturer and then further defines that identification by selecting the product's model or chassis number. The program then accesses the appropriate manual and allows the user to choose from among a variety of supported options, including the options associated with databases 46–68. The user's choice generally responds to the information that is then desired in light of the databases supported. For example, once the user has accessed a particular diagram and located a desired assembly, module, component or other part on that diagram, the user has the option to access further information associated with that assembly, module, component or part. In that regard, the user can view any information about that component that is stored in the locations database 24. Moreover, a user can locate the particular component on a schematic diagram and then choose to view the component on a circuit board diagram via, e.g., a menu choice.

In the absence of this invention, a service technician manually pages through various circuit schematic diagrams attempting to locate the component of interest. The technician also manually reviews various circuit board diagrams in order to locate the same component of interest on a drawing that illustrates the actual component layout within the device. Such procedures typically are unduly time consuming.

With a system designed according to this invention, by comparison, one or more menus preferably are made available on the computer screen and, responsive to menu choices, the user is transferred between and among diagrams illustrating the component of interest. This operation is provided through the linking information and/or cross-references portion of the main data set 20. The cross-referencing capability is a result of the programming of the main data set.

Figure 3:
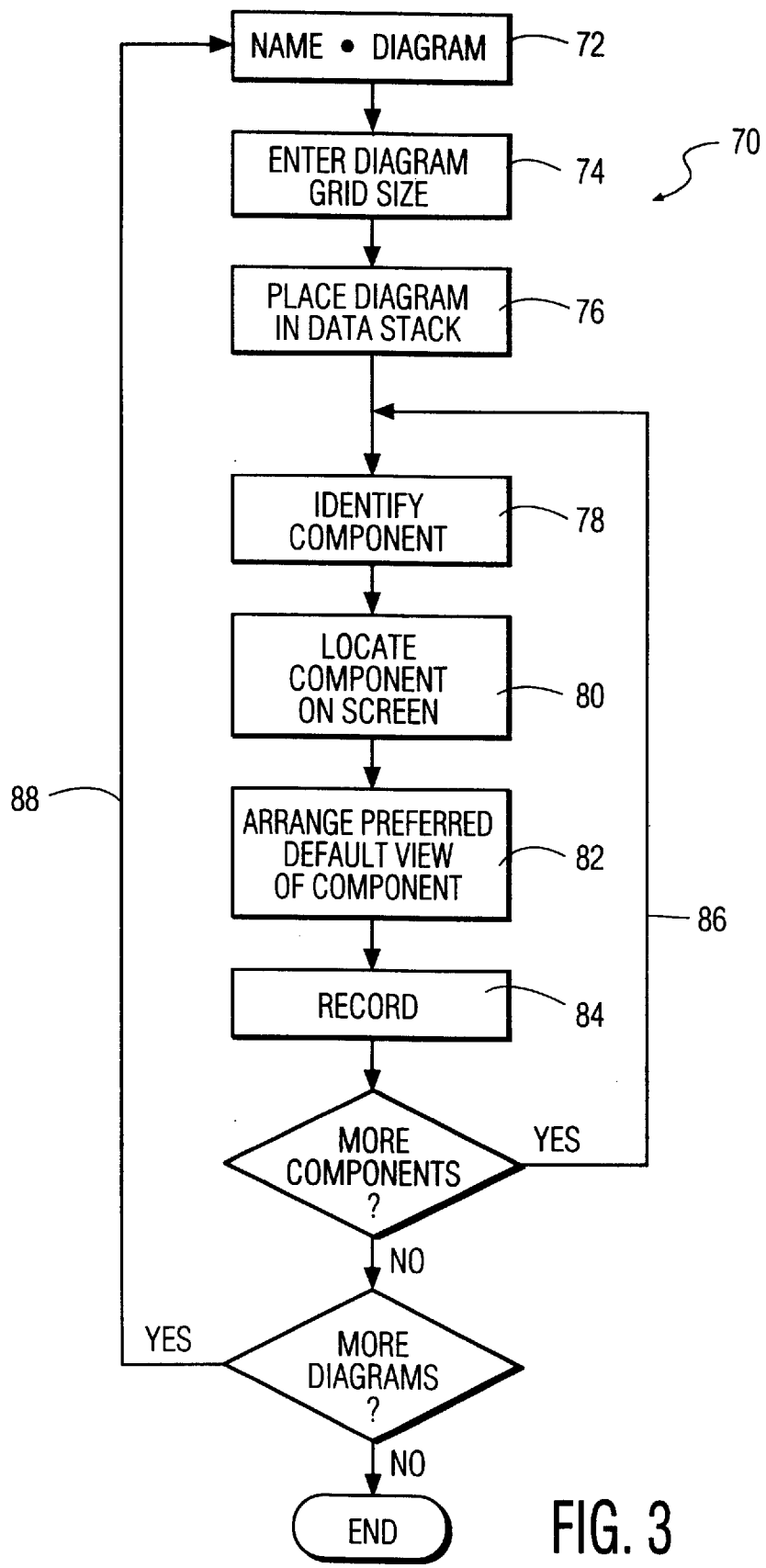
FIG. 3 is a flow chart diagram illustrating a method of programming the data set of FIG. 1.

FIG. 3 illustrates a preferred methodology for programming the main data set 20 in a flow chart diagram 70. As mentioned above, the main data set 20 preferably includes information from a technical manual. The manual typically includes a plurality of diagrams and textual information, the diagrams typically being the most frequently used portion of the manual.

The main data set 20 preferably is programmed to include the diagrams in a stack file. To do so, a diagram name is entered at step 72. Thereafter, the diagram grid size or dimensions are entered at step 74. The diagram itself is then placed in the stack at step 76. In this step, the diagram can be converted from paper, such as by a conventional scanning method. Alternatively, the diagram can be entered directly or transferred from a binary form, or otherwise in such manner as comports with the diagram's original form.

Once the diagram is converted and stacked, the individual circuits and/or components on the diagram are identified in step 78. (This portion of the programming process preferably is carried out in a Windows™ programming environment, using a graphics engine, such as AccuSoft IFL, as previously referenced. Alternatively, programming could be accomplished in a DOS, or other, environment depending on the preference of the programmer.)

The programmer identifies the components in order to program the various components from the diagram into the appropriate database. Identifying the components typically includes assigning a component name, number or other identifier to each respective component. Thereafter, the component is located on a diagram displayed on the screen at step 80. Following step 80, the programmer arranges the preferred default view of the component in step 82, which step includes a preferred zoom factor and position on the screen. In step 84, the database records the location of the default view for the component on the diagram, given the known grid size and zoom factor.

Steps 78–84 are repeated for other selected, and preferably all, components on a particular diagram, as indicated in step 86. If more diagrams are to be entered, the entire procedure is repeated for each diagram, as indicated by step 88.

The ability to cross-reference between diagrams is provided within the main data set 20. The programmed data set 20, therefore, provides for viewing the same component in all diagrams in which that component appears. The diagrams preferably are placed within a data stack in an arrangement that facilitates cross-referencing.

Figure 4:
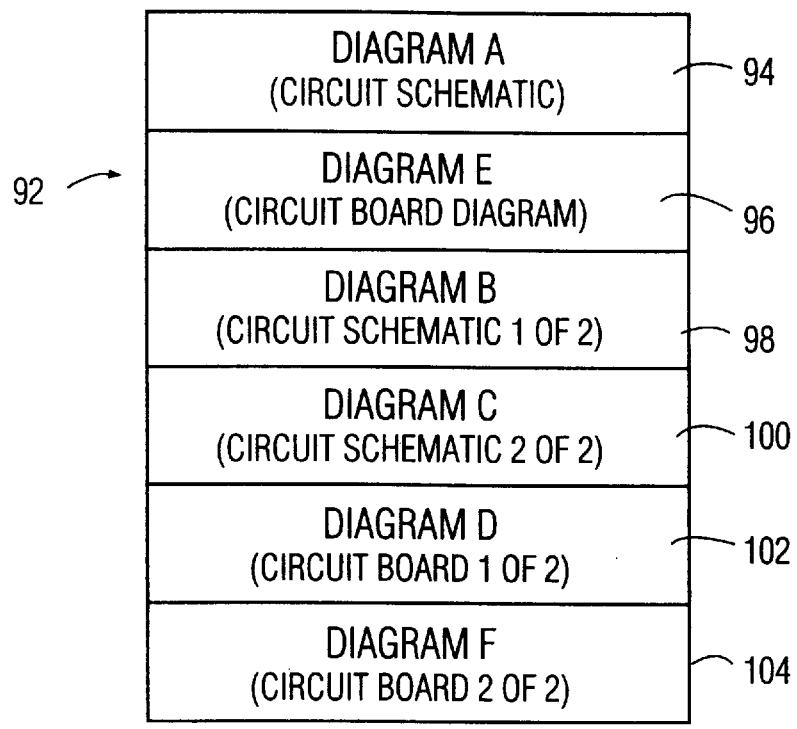
FIG. 4 is a schematic diagram illustrating a portion of the data set of FIG. 1.

FIG. 4 schematically illustrates a stack of diagrams 92. Diagrams can be arranged within a stack in any order. The pointer that establishes any required relationships between diagrams is accomplished from pointer fields within the databases used to establish user lists and control access to graphics stack files. During programming, each component's unique identifier is established either manually or automatically depending on the original file's format. For scanned images, components preferably are identified manually. For vector converted diagrams, the component information imbedded therein typically is in form suitable for automatic identification.

Accordingly, the main data set 20 includes information that enables the program to move from one diagram to the next, displaying the same component, as directed by the menu or other choices of a user. The stack of diagrams 92 is exemplary of this feature. In that regard, diagram 94 of a circuit schematic corresponds to diagram 96 of a circuit board diagram. Diagrams 98 and 100, in turn, are two parts of the same diagram and, therefore, are preferably placed adjacent to each other in the stack 92. Corresponding to diagrams 98 and 100, respectively, are diagrams 102 and 104 which comprise circuit board diagrams.

Recording the information about individual components creates a custom grid system of locations for the various components (even when the original diagram does not include such a grid system). Moreover, the recorded information cross-references schematic diagrams to circuit board diagrams. Component identity and component coordinates on the screen, and within individual diagrams, also are cross-referenced. Further, the programmer-selected default display of that component (including zoom factor, for example) is also stored associated to that component.

Accordingly, a user of the system is enabled, such as by simple menu choices, to locate particular portions of a diagram or components therein, or both, and to quickly gain further information regarding such portions and/or components, such as by cross-referencing to written descriptions or other diagrams.

A user of a system designed according to this invention does not generally accomplish the programming steps illustrated in FIG. 3. Rather, such programming steps are accomplished during a programming phase for creating a system according to this invention. The user of the system is simply presented with the completed service manual in a suitable computer format, i.e., resulting from such programming phase.

A significant advantage provided by this invention is the ability for a user, such as a service technician, to access the information within the service manual according to the problem that is encountered. For example, if a customer's television produces no sound, the system and methods hereof enables the service technician to quickly access the appropriate electronic manual and, by making one or more selections, to quickly determine whether guidelines are available for effecting an appropriate repair.

Figure 5:
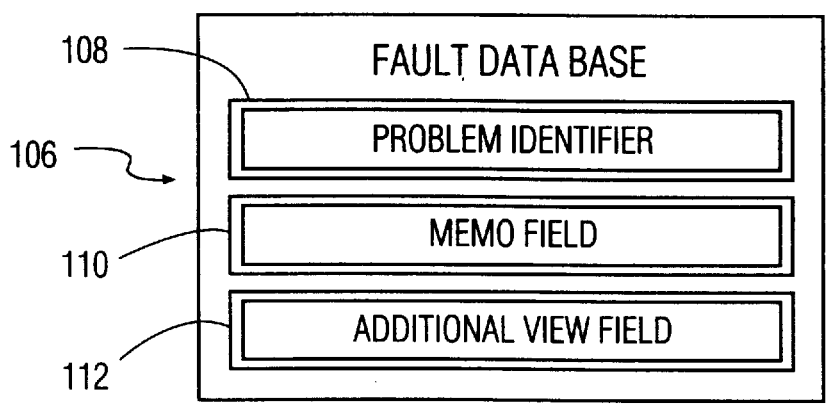
FIG. 5 is a schematic diagram of a second database for use with a system of this invention.

In this invention, fault information preferably is placed within a fault database 106 as illustrated in FIG. 5. The fault database includes a problem identifier portion 108, a memo field 110 and an additional view field 112. The problem identifier portion 108 enables the user to choose from among several known problems associated with the particular device. For each problem provided in the problem identifier portion 108, a separate memo field 60 preferably is provided. Each such memo field 60 preferably identifies and describes the problem in such manner that the service technician can compare the information therein with the defects either reported by the customer, or identified by some preliminary performance tests conducted by the technician, or otherwise.

The additional view field 112 provides further information, such as diagrams, clips or other tutorial material to assist the technician. For example, the field 112 can provide illustration of how to add additional circuit components or how to change circuit boards, which procedures generally are not illustrated in the original drawings of the service manual.

Accordingly, providing a fault database 106 enables a user to find solutions of a problem by the user making one or more choices, e.g., menu selections. Fault databases may be incorporated into the main data set 20, or may be provided separate therefrom, or both. A separate database 106 is preferred, because such structure enables manufacturers to augment or supplement the main data set 20 upon becoming aware of each new problem with a product, particularly after the product has been on the market. In that regard, the fault database 106 preferably is updated periodically by providing update information to the user on floppy disks or via online transmission, or otherwise. Preferably, the user ultimately controls transfer and/or recording of that information to/in the fault database.

Another significant advantage provided by this invention is that diagrams can be updated with or without replacing the existing diagrams in the main stack 22 of the main data set 20. Yet another significant advantage of this invention is the ability to augment the main data set 20 and, therefore, the service manual, with optional accessory and/or supporting programs. Such programs preferably are stored in database 32, as illustrated in FIG. 1. One example is a pricing information program. This program typically includes not only pricing information regarding various components, but also current commercial availability, potential substitutes and other information.

This invention provides the ability to combine various forms of technical information in one easily-manipulated source. Having such variety of technical information so combined and available, and in an inter-related and cross-referenced structure, provides significant advantages over prior systems.

Figure 6:
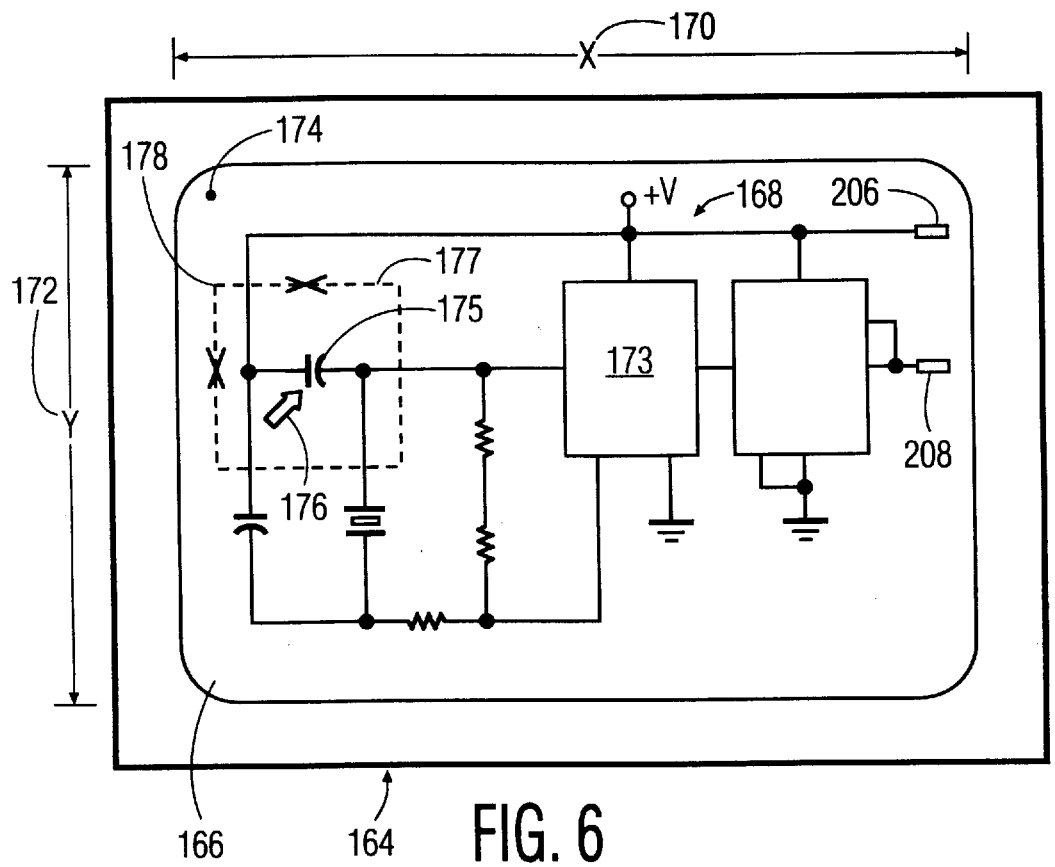
FIG. 6 diagrammatically illustrates one of the features of this invention.

FIG. 6 illustrates a display on a monitor 164 having a viewing screen 166. A portion of a circuit schematic diagram 168 is shown. The display on the screen 166 has a maximum X dimension 170 and a maximum Y dimension 172. The upper left-hand corner 174 of the screen preferably is used as the base point or origin of the display. The origin point 174 preferably is defined as having an X coordinate value of zero and a Y coordinate value of zero. The screen units defining the size of the screen's grid are referred to as screen pixels, while the display units of the image displayed on the screen are referred to as image pixels.

The diagrams stored in the main database have a defined grid size, which is made up of programmed diagram units. The image pixels are related to the programmed diagrams units by the zoom factor. The programmed diagram units are set during the programming phase, described above. The screen grid size varies depending on the particular computer that is used, with the number of screen pixels being set by the size of the screen.

This invention enables the user to zoom in or out in order to select less or more of a particular diagram for viewing. The invention preferably also enables a user to pan or move around within a displayed diagram. A dynamic zoom feature preferably is provided in a Windows™ environment, which can be operated by manipulating the mouse. In one aspect, the dynamic zoom feature is effected by depressing a predetermined mouse button and moving the mouse in a predetermined direction, so as to automatically increase the zoom factor. The dynamic zoom feature preferably zooms in and out as to the displayed components located about a central portion of the screen. In FIG. 6, for example, depressing the left mouse button and moving the mouse to the right zooms in such that component 173 becomes increasingly large on the screen. Similarly, depressing the left mouse button and moving the mouse to the left zooms out, e.g., decreases the zoom factor, such that more of the display around component 173 is shown. In this feature, the graphics engine preferably is programmed to convert the movement associated with the mouse into a preselected adjustment in the zoom factor.

Consider an example wherein a service technician desires to zoom in on capacitor 175 shown in FIG. 6. With the display as illustrated, the dynamic zoom, just described, will not achieve the result desired by the user. One option would be to pan over in the circuit diagram in order to place the capacitor 175 in the center of the screen and then use the dynamic zoom feature as described above. Alternatively, this invention enables a user to select an individual component, such as capacitor 175, and to zoom in or out on that component and, in doing so, to display whatever amount of the surrounding circuitry desirable fits in the screen in light of the selected amount of zoom.

More specifically, under this alternative feature for zooming, relative to the capacitor 175, the user manipulates the mouse cursor 176 to place it on the capacitor 175, or whatever component the user is particularly interested in viewing. Once the mouse cursor is appropriately placed, the user triggers the zoom by exercising a predetermined operation, e.g., double-clicking the left mouse button. The program then automatically zooms in or out on that component at a preselected zoom rate. The zoom rate comprises a predetermined or selectable successive incrementing or decrementing of the zoom factor. If selectable, it preferably is set by the user when configuring the program for use. In such case, one or more zoom rates preferably can be set, each being associated with a separate triggering operation and direction of zoom. Along with zooming on the selected component, the program preferably automatically centers the selected component in the screen 166. In addition, the program preferably provides for returning directly to the zoom factor prevailing prior to triggering any zoom operation, e.g., by double-clicking the right mouse button.

The position of the mouse cursor 176 on the screen is recognized by the graphics engine. The mouse position is dependent on the environment and is defined in terms of the screen pixels. The program converts screen pixel values into image pixel values to determine the location of the mouse cursor within the displayed diagram at the current zoom rate.

The preselected zoom factor associated with a double-click procedure determines the size of the expanded view of the selected component. The broken-lined box 177 in FIG. 6 is an example of the amount of the display that will be shown when the zoom is completed. The dimensions of the box 177 are referred to as the crop width of the display. The crop width is proportional to the zoom factor. Because the zoom factor is known, the crop width is also known. The graphics engine subtracts one-half of the X crop width from the mouse location in image pixels. The graphics engine also subtracts one-half of the Y crop width from the mouse location in image pixels. The resulting X and Y values define the upper left-hand corner of the display after the zoom is completed. Accordingly, the location 178 is moved to the origin point 174. Further, the crop width of the box 177 is made equal to the width of the screen (i.e., dimensions 170 and 172). As applied to the example, this procedure moves the capacitor 175 to the center of the screen and enlarges the view thereof.

Figure 7:
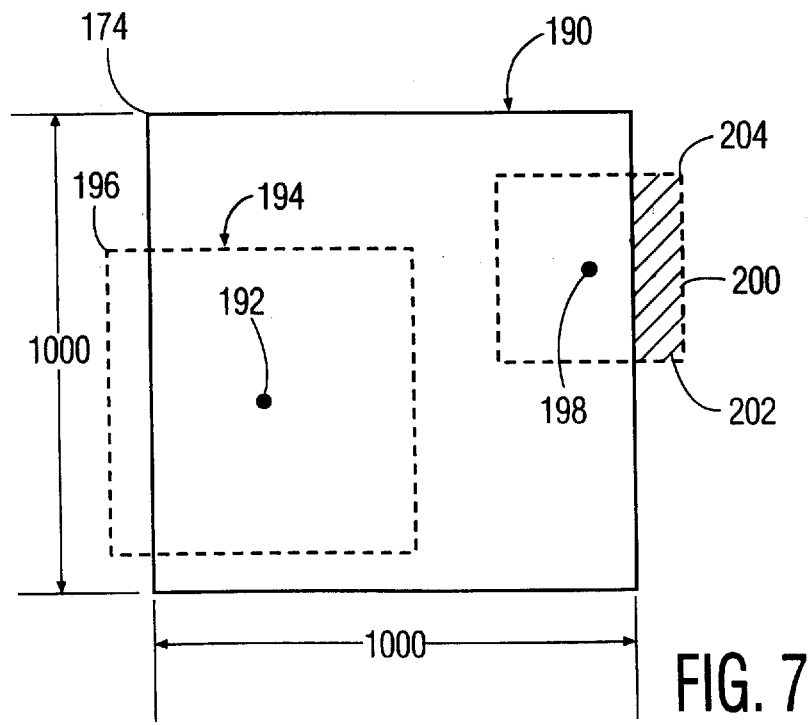
FIG. 7 diagrammatically illustrates another feature of this invention.

An additional preferred feature of this invention is that the program automatically corrects a zoomed-in view to avoid having the display omit any part of the diagram. Referring now to FIG. 7, assume that the screen 190 has a grid size of 1,000 by 1,000 screen pixels, and that a component is located at the screen location 192 and that the user desires to zoom in on that component by the double-click procedure. Assume further that the preselected zoom factor would result in a crop width shown as box 194 illustrated in broken lines in FIG. 7. In such case, the upper left-hand corner 196 of the box 194 is outside of the screen 190. Accordingly, in determining the X and Y coordinates of the corner 196, the value of the X coordinate will be negative when converted to screen pixels. In order to place the component 192 in the center of the screen after the zoom is completed, the graphics engine converts the initial calculation of the upper left-hand corner 196 into a value of (0, Y) in screen pixels by adding the appropriate amount of units in the X direction to every point within the crop box 194, where the addition to the X value of each coordinate is made in image pixel units. The Y value of the origin after zooming is defined by the value of the upper line defined by box 194.

Assume now that the user desires to zoom in on a component located at 198 in FIG. 7. Assume further that the zoom factor would result in a crop box 200 as illustrated. The zoom width of the crop box 200 in this example is assumed to be 400 image pixels. Because the screen 190 is assumed to have a maximum height and width of 1,000 screen pixels, the difference between the zoom width and the maximum image width thereby is 600 screen pixels. In the absence of compensation, performing the converting calculations on all of the locations within the crop box 200 results in the portion of the image 202 being off the screen and the component 198 not being centered in the screen.

In such situation, the graphics engine preferably is programmed to compensate. A preferred compensation has maximum X and Y values being determined by subtracting the zoom width from the image width. In this case, the maximum X and Y values are both 600 (i.e., 1000–400 screen pixels). As the image pixels of the portion of the diagram within the crop box are converted to screen pixels, the coordinates are compared to determine if any X or Y values are greater than the maximum X or Y values. In this example, the portion of the crop box 202 would have X values greater than 600 after the conversion. Therefore, the graphics engine converts or adjusts the image pixels such that the maximum X value is equal to 600. After the adjustment, the image pixels are effectively converted into screen pixels, the zoom being complete.

The same or similar zoom correction functions preferably are applied during a dynamic zoom operation.

This invention also provides for dynamically panning throughout a displayed diagram. In one embodiment, this is accomplished by depressing the right mouse button and moving the mouse cursor about the screen in whatever direction or directions the user desires to move through the diagram.

This invention also preferably includes the feature of preventing the user from panning off the edge of the diagram. In some graphics display programs where a user is permitted to effectively move around the display on the screen, it is possible to pass off of the edge of a diagram such that a portion of the screen becomes blank, no longer including any part of the diagram. In a preferred embodiment, this invention prevents such a situation because, as the user selects movement by moving the mouse cursor about the screen, the graphics engine constantly compares the desired movement with the maximum X and Y values to determine whether the user is moving off of a diagram.

Referring again to FIG. 7, the maximum value of the screen pixels in the X and Y directions are generally known, e.g., 1,000 in this example. The overall grid size of the diagram is also known because it is entered and recorded during the programming phase as described above. Also, the graphics engine preferably continuously monitors the zoom rate. Moreover, the coordinates of a current display are known in image pixels. As such, the relationship between the maximum screen size and the diagram size is known, given the current zoom rate. Accordingly, as the user moves about in the diagram at any current zoom rate, the graphics engine continuously monitors the edges of the screen so as to determine when the edge of the diagram is reached on the screen. Preferably, the graphics engine monitors the upper left corner of the screen in screen pixels. The graphics engine, upon detecting that an edge of the diagram has been reached, preferably precludes the user from moving further in that direction, even if the mouse button is continuously depressed and the mouse moved in that direction.

Referring again to FIG. 6, the circuit 168 includes two connector points (or hot spots) 206 and 208. These connector points indicate that the circuits, which terminate at such points in the diagram, continue in another portion of the same diagram or in a second diagram. This invention preferably provides a feature that enables the user to move automatically from one connector point to one or more corresponding connector points.

In one embodiment, the connector point feature is implemented so that the user first selects the feature, e.g., from a menu option, and so that the user triggers this feature's function by positioning the mouse cursor 176 in association with the connector point 206 and then exercising a predetermined operation, e.g., a click on a mouse button. This switches the display from that shown in FIG. 6 to the other portion of that diagram, or to the second diagram, as the case may be, so as to display another point corresponding to the connector point 206. The feature preferably includes some indication that the switch has occurred, e.g., an audible on visual cue. Preferably, the visual cue is a flashing box associated with the new connector point.

Programming this connector point feature preferably is accomplished when the main data set 20 is created. Alternatively, the connector point can be programmed for any particular diagram or diagrams other than at such data set creation. In any case, the connector point information preferably is stored in the separate hot spots database 30. Alternatively, the connector point information can be integrated into the main data set 20 and, if so, preferably within the location database 24.

The connector points are created by first identifying the location on the diagram that requires a connector point. (In a WindowSυ environment, the mouse cursor 176 can be used to identify each such location.) A selected label (a rectangle, for example, as shown in the illustrated embodiment) is preferably drawn about the so-located connector point, the label having selected dimensions for a default display value. That location is then recorded in the database(s) established for connector point information. The programmer then moves to the other portion of the diagram or the second diagram, as the case may be, and repeats the process to mark the corresponding connector point and to draw the selected label about that point. Then these two points are linked as corresponding to each other.

Two or more connector points can be linked. Where multiple connector points are linked, the program preferably moves from the first to the second, to the third, to the fourth, and so on until the last connector point has been reached, whereupon the program returns to the first point. By comparison, where only two connector points are linked, clicking on the first point will move the display to the second point and clicking on the second point will move the display to the first point.

Programming the connector points, for example, into the hot spots database 30 can be accomplished using various commercially available systems. In the preferred embodiment, the Accusoft Redlining Tool Kit program, available from Accusoft Corporation of Massachusetts, is used.

Providing connector points as described is yet another significant advantage of this invention because it enables a service technician to easily, quickly and accurately move about a circuit.

A database protection scheme preferably is implemented to prevent improper use or copying of information. Each database preferably is encrypted. The graphics engine is enabled to decrypt the databases, such that databases will not work if sought to be used with any other engine except the one originally provided.

Copy protection is achieved using either proprietary or commercially available programs, the latter including the program distributed by AZ-TECH Software, Inc., identified by the Everlock brand. The Everlock program generally is used to limit the licensed users to loading the software program on only one computer at a time. However, it is also possible to configure the protection scheme to allow a user to install this invention on any number of additional computers, such by using a standard Windows™ Setup program.

The service manual databases are stored and accessible in various channels and media, such as by floppy disk, CD-ROM, modem or otherwise. In all of these media and channels, the databases preferably are provided to a user in compressed form, in a single file. In such case, the databases are decompressed for use. The decompression process places each of the databases in condition for use.

Diagrams and text generally are in compressed form. Diagrams preferably are compressed using commercially available methods, such as the TIFF Group IV standard. Text preferably is compressed using commercially available methods, such as Compression Plus, available from Micro-Help of Marietta Ga.

The foregoing description is exemplary rather than limiting in nature. Variations and modifications to the disclosed embodiment will become apparent to those skilled in the art that do not depart from the scope and spirit of this invention. For example, technical information in form or forms other than service manuals can be included.

What is claimed is:

1. A system for accessing and using technical hardware related data such as hardware service data, comprising:
    a data set containing the technical data including
        identifying information identifying each of a plurality of hardware items,
        descriptive information describing each of said plurality of hardware items,
        a plurality of hardware diagrams each containing selected ones of said plurality of hardware items, each said item on each said hardware diagram having a specified diagram location, and
        linking information linking said identifying information, said descriptive information and said diagram location for each of said hardware items;
    a control module for controlling access to said data set; and
    an interface device for interfacing with said control module to locate a selected one of said hardware items in said data set on one of said hardware diagrams or through one of said identifying information or said descriptive information and wherein said control module automatically accesses the other of said identifying or descriptive information and any of said hardware diagrams containing said selected hardware item through said linking information in response to said interface device.

2. The system of claim 1, wherein said data set and said control module are stored in a computer memory.

3. The system of claim 2, wherein said interface device is external to said computer memory and generates signals that are interpreted by said control module to manipulate and control access to said data set.

4. The system of claim 1, wherein some of said items are repeated on more than one of said diagrams and wherein said linking information further links any of said diagrams that contain said repeated items and wherein said control module automatically accesses said diagram locations for each said item on said linked diagrams in response to said interface device.

5. The system of claim 4, wherein the technical data describes electronic products, said items are electronic component parts of said products, and said diagrams include schematic diagrams and printed circuit board diagrams illustrating an arrangement of said component parts and wherein said linking information links schematic diagrams with printed circuit diagrams containing the same component parts.

6. The system of claim 4, wherein said data set and said control module are stored on a computer memory and wherein said plurality of diagrams are stored within a diagram database within said data set and wherein each diagram is placed in a stack within said diagram database and has a stack identifier, said stack identifiers being a portion of said linking information.

7. The system of claim 1, wherein said technical data describes electronic products, said items are electronic component parts of said products and said data set further comprises instructional information describing how to remedy known fault conditions for a preselected product and pertinent component parts of the product and wherein said linking information further links said instructional information to said diagram locations for said pertinent component parts and to said descriptive and identifying information for said pertinent component parts.

8. A method of arranging a computer memory to contain technical hardware-related data such as hardware service data including diagrams having a plurality of hardware items on each diagram, comprising the steps of:

(A) identifying each of the hardware items on each hardware diagram and assigning a unique identifier to each hardware item;

(B) describing each of the hardware items identified in step (A) with descriptive information;

(C) locating each hardware item on the hardware diagrams and determining a hardware diagram location for each hardware item on each hardware diagram; and (D) linking the hardware diagram locations from step (C) to the identifiers from step (A) and the descriptive information from step (B) for each hardware item, whereby the technical data pertaining to each hardware item is accessible by one of the identifier, the descriptive information or the hardware diagram location and wherein access to the other two are automatically available.

9. The method of claim 8, wherein some of the items are on more than one of the diagrams and wherein step (C) is performed by locating each item on each diagram and determining a diagram location for each item such that said some of the items each have more than one diagram location.

10. The method of claim 9, wherein step (D) is performed by lining each diagram location for each item.

11. The method of claim 9, further comprising the step of storing the diagrams within a database by placing each diagram in a stack within the database and linking the diagrams in the stack that contain the same item according to the position of the diagram in the stack and the item identifier.

12. The method of claim 8, wherein the technical data describes an electronic product and wherein the items are electronic component parts of the product and the method further comprises determining a condition regarding the product;

determining a procedure for handling the condition including identifying which of the items are involved in the procedure;

describing the procedure; and linking the procedure description to the diagram locations for the items involved in the procedure.

13. The method of claim 8 wherein step (C) is performed by visually displaying the diagrams on a visual display associated with the computer memory and manipulating the display to locate each item and storing the diagram location for each item.

14. The method of claim 13, further comprising arranging a default display view of each item on each diagram and storing the default display in the computer memory such that the item is automatically displayed in the default display view on the visual display each time the diagram location is accessed.

* * * * *